(12) United States Patent
Yang et al.

(10) Patent No.: US 11,031,542 B2
(45) Date of Patent: Jun. 8, 2021

(54) CONTACT VIA WITH PILLAR OF ALTERNATING LAYERS

(71) Applicant: International Business Machines Corporation, Armonk, NY (US)

(72) Inventors: Chih-Chao Yang, Glenmont, NY (US); Daniel Charles Edelstein, White Plains, NY (US); Michael Rizzolo, Delmar, NY (US); Theodorus E. Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 82 days.

(21) Appl. No.: 16/401,206

(22) Filed: May 2, 2019

(65) Prior Publication Data

US 2020/0350486 A1 Nov. 5, 2020

(51) Int. Cl.
*H01L 43/02* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/12* (2013.01)

(58) Field of Classification Search
CPC ........ H01L 43/02; H01L 27/222; H01L 43/12
See application file for complete search history.

(56) References Cited

U.S. PATENT DOCUMENTS

| | | | |
|---|---|---|---|
| 3,808,680 A | 5/1974 | Lafrate et al. | |
| 5,691,238 A | 11/1997 | Avanzino et al. | |
| 7,629,264 B2 | 12/2009 | Bonilla et al. | |
| 8,357,609 B2 | 1/2013 | Ryan | |
| 9,324,650 B2 | 4/2016 | Edelstein et al. | |
| 9,634,243 B1* | 4/2017 | Chuang | H01L 27/228 |
| 9,761,489 B2 | 9/2017 | Mebarki et al. | |
| 10,199,342 B2 | 2/2019 | Zhan et al. | |
| 2001/0050385 A1 | 12/2001 | Kotecki et al. | |
| 2006/0141763 A1* | 6/2006 | Brody | H01L 21/67207 438/622 |
| 2007/0026601 A1 | 2/2007 | Basceri et al. | |
| 2012/0049323 A1* | 3/2012 | Ng | H01L 23/5228 257/537 |
| 2012/0080793 A1 | 4/2012 | Danek et al. | |
| 2012/0326250 A1* | 12/2012 | Gaidis | H01F 10/3254 257/421 |
| 2017/0092692 A1* | 3/2017 | Kalnitsky | H01L 43/12 |
| 2017/0194557 A1* | 7/2017 | Chuang | H01L 27/228 |
| 2017/0222128 A1* | 8/2017 | Sung | H01L 27/228 |
| 2017/0301728 A1* | 10/2017 | Chuang | H01L 27/228 |

(Continued)

*Primary Examiner* — Peter Bradford
(74) *Attorney, Agent, or Firm* — Cantor Colburn LLP; James Nock

(57) ABSTRACT

Back end of line (BEOL) metallization structures and methods generally includes forming a landing pad on an interconnect structure. A multilayer structure including layers of metals and at least one insulating layer are provided on the structure and completely cover the landing pad. The landing pad is a metal-filled via and has a width dimension that is smaller than the multilayer structure, or the multilayer structure and the underlying metal conductor in the interconnect structure. The landing pad metal-filled via can have a width dimension that is sub-lithographic.

12 Claims, 5 Drawing Sheets

(56) References Cited

U.S. PATENT DOCUMENTS

| | | | |
|---|---|---|---|
| 2018/0069051 A1* | 3/2018 | Ueki | H01L 27/249 |
| 2018/0248112 A1* | 8/2018 | Chuang | H01L 43/12 |
| 2018/0374895 A1* | 12/2018 | Hsu | H01L 23/5226 |
| 2019/0074440 A1* | 3/2019 | Yang | H01L 45/085 |
| 2019/0221736 A1* | 7/2019 | Houssameddine | H01L 27/228 |
| 2020/0006628 A1* | 1/2020 | O'Brien | H01F 41/302 |

* cited by examiner

CONTACT VIA WITH PILLAR OF ALTERNATING LAYERS

BACKGROUND

The present invention generally relates to semiconductor integrated circuits, and more particularly, to a contact via for back end of line metallization structures.

Integrated circuit processing can be generally divided into front end of the line (FEOL), middle of the line (MOL) and back end of the line (BEOL) metallization processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL metallization processing to complete the integrated circuit structure. As such, BEOL metallization processing generally involves the formation of insulators and conductive wiring. Often, the BEOL metallization process can further include fabrication of magnetoresistive random access memory (MRAM) devices, capacitors, resistors and the like.

SUMMARY

Embodiments of the present invention are generally directed to semiconductor structures including one or more back end of the line metallization layers and methods of fabrication. A non-limiting example of the semiconductor structure including a back end of line (BEOL) metallization structure includes a vertical via structure intermediate and in electrical contact with an overlying pillar device and an underlying conductor. The vertical via structure includes an insulator material on sidewalls thereof and has a width dimension less than the width dimensions of the overlying pillar device and the underlying conductor. The pillar device includes alternating layers of a metal and a metal oxide.

A non-limiting example of a method of fabricating a BEOL metallization structure according to embodiments of the invention includes forming a first interconnect structure by patterning a first dielectric layer to form a trench therein and depositing a metal conductor in the trench. A recess is formed in the metal conductor and a second dielectric layer is formed on the first interconnect structure, wherein the second dielectric layer fills the recess in the metal conductor. The second dielectric layer is planarized to the first dielectric layer and patterned to form a via contact opening to expose a surface of the metal conductor in the first interconnect structure. The via opening is filled with a metal to form a metal filled via. Layers of metal and at least one insulating layer are deposited to form a multilayer stack. A metal hardmask is deposited onto the multilayer stack. A dielectric hardmask is deposited onto the metal hardmask. The dielectric hardmask and the metal hardmask are patterned to provide a patterned dielectric hardmask and metal hardmask, wherein the patterned dielectric hardmask and metal hardmask overlies the metal filled via. The multilayer stack is etched using an ion beam etch process to form a pillar device, wherein a width dimension of the pillar device is greater than a width dimension of the metal filled via.

A non-limiting example of a method of fabricating a BEOL metallization structure includes forming a first interconnect structure by patterning a first dielectric layer to form a trench therein and depositing a metal conductor in the trench, wherein the metal conductor has a top surface coplanar to a top surface of the first dielectric layer. A recess is formed in the metal conductor. A second dielectric layer is formed on the first interconnect structure, wherein the second dielectric layer fills the recess and overlies the first dielectric layer. The second dielectric layer is reactive ion etched to form a via opening and expose a surface of the metal conductor in the first interconnect structure. The via opening is filled with a metal to form a metal filled via. Layers of metals and at least one insulator material are deposited to form a multilayer stack. A metal hardmask layer and dielectric hardmask layer are deposited onto the multilayer stack. The dielectric hardmask and the metal hardmask layers are patterned to provide a patterned dielectric hardmask and metal hardmask, wherein the patterned dielectric hardmask and metal hardmask overlie and have a width dimension greater than a width dimension of the metal filled via. The multilayer stack is etched using an ion beam etch process, wherein the multilayer stack completely covers the metal filled via.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention generally relates to BEOL metallization structures and processes that include multilayered structures, also referred to herein as pillar device structures, with alternating layers of metals and insulators, e.g. oxides, electrically coupled an underlying landing pad which in turn is electrically coupled an underlying interconnect line, i.e., conductor, wherein the landing pad has a smaller width dimension than the interconnect line and the pillar device structure.

Figure 1:
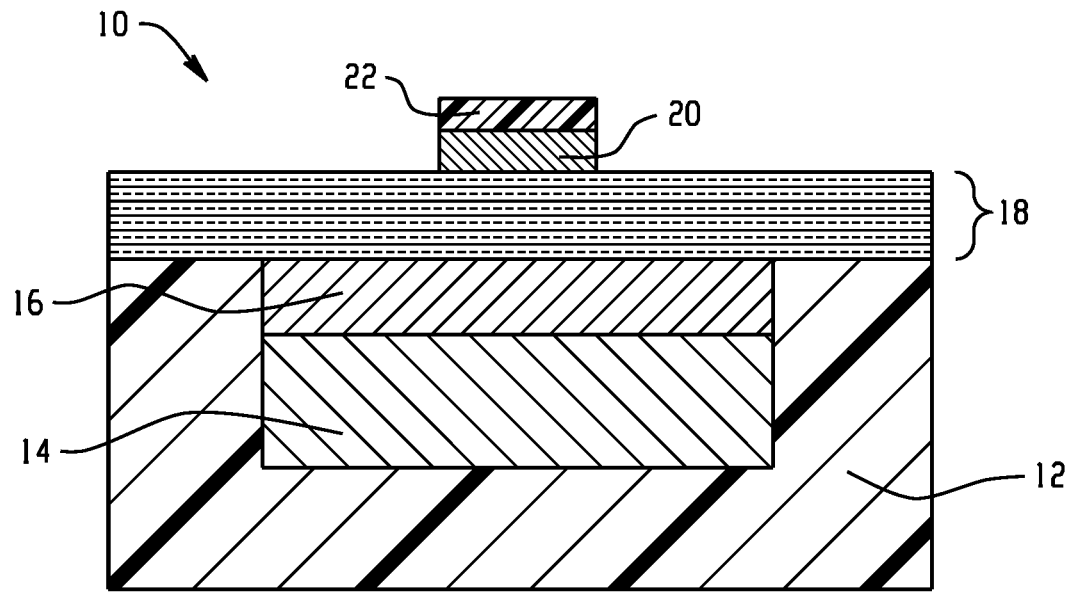
FIG. 1 depicts a cross section of a prior art structure for forming a pillar device structure on a metal landing pad prior to patterning of the multilayer structure.
Figure 2:
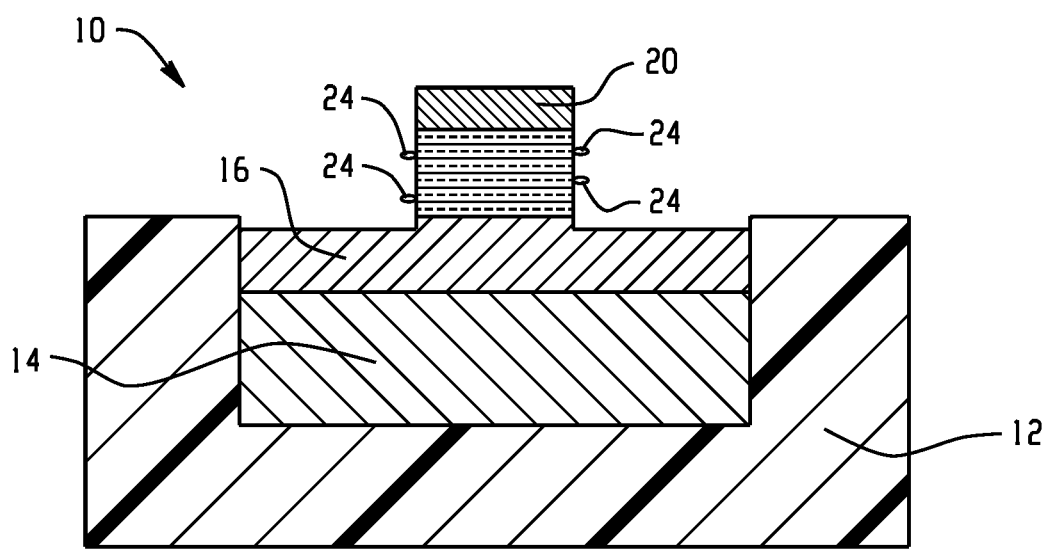
FIG. 2 depicts a cross section of a prior art structure for forming a pillar device structure on a metal landing pad subsequent to patterning the pillar device structure.

Prior pillar device structures formed during BEOL metallization processing included a landing pad, or in some cases did not include a landing pad and these structures were formed directly onto a bottom electrode, which typically had a width that was equal to or greater than the pillar device structure and the underlying conductor. One of the problems with these prior art pillar device structures is that patterning the pillar device structure, which is typically done by ion beam etching, results in resputtering (i.e., redeposition) of underlying landing pad or interconnect metals onto the sidewalls of the pillar device structure. In the case of pillar device structures that include insulating barrier or highly resistive layers, such metal redeposition on the sidewalls of those layers can result in shorts or shunt conduction paths, and hence can impact device yields. Prior art represented by FIGS. 1-2 illustrate a typical process for forming the pillar device structure. In FIG. 1, there is shown a cross section of a portion of a back end of the line structure 10 including a dielectric layer 12. A conductor 14 is formed in the dielectric using lithographic processing, which further includes a relatively large landing pad 16, which is also from of a conductive metal. The resulting structure is typically subjected to a planarization process such as chemical-mechanical planarization in which an abrasive slurry is applied by a rotating platen to form a planar surface. A pillar device structure 18 including alternating layers of metal and an insulator are then deposited onto the planar surface. A metal hard mask 20 and a dielectric hardmask 22 are then deposited on the pillar device structure 18 and patterned, which will be used to define the width of the pillar device structure.

Prior Art FIG. 2 illustrates a cross section subsequent to patterning the pillar device structure 18 using an anisotropic etch process such as a combination of reactive ion etching (RIE) including a high sputtering component, or followed by non-reactive ion beam etching (IBE). In the RIE sputtering or IBE processes, materials are removed from the etch target by bombardment with directed and precisely controlled ion energies resulting in high precision removal. One of the problems with RIE sputtering or IBE of pillar device structures including alternating layers of metal and formed on a landing pad is that the metal forming the landing pad 24 can be redeposited onto the sidewalls of the pillar device structure, which can significantly degrade the pillar device performance and yields.

In embodiments of the present invention, the landing pad is smaller than the intended width of the pillar device structure and is not exposed during RIE sputtering, which prevents metal redeposition during IBE. The smaller landing pad can even be sub-lithographic in width or diameter, by the inventive method. Thus in the present invention, the landing pad is not exposed during patterning of the pillar device structure, and only insulating material 12 can be redeposited on the pillar device structure's surface.

It is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOS technology, MOSFET devices, and/or FinFET devices. By way of non-limiting example, the semiconductor devices can include, but are not limited to MOSFET and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments of the invention, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Turning now to a more detailed description of aspects of the invention, FIGS. 3-12 schematically illustrated is a process flow for forming an integrated circuit including at least one patterned pillar device structure including alternating layers of metal and an insulator in accordance with embodiments of the invention.

Figure 3:
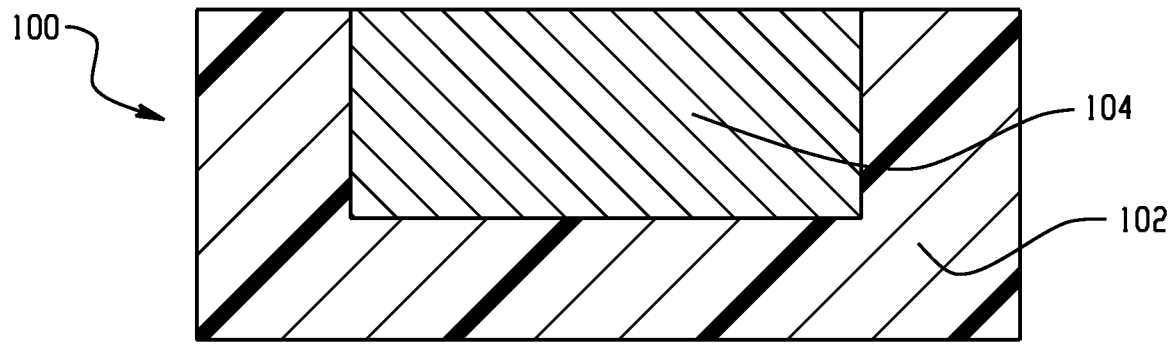
FIG. 3 depicts a cross section of a structure including a first interconnect structure in accordance with one or more embodiments of the present invention.

In FIG. 3, there is shown a portion of an integrated circuit including a BEOL metallization structures 100 including a patterned dielectric layer 102, e.g., an interlayer dielectric, and a conductor 104, e.g., a line, formed in the interlayer dielectric.

Typically, the integrated circuit is subjected to a planarization process subsequent to deposition of the conductor, which usually includes the formation of an overburden. By way of example, the surface can be planarized using an electropolishing process. In an electropolishing process, small amounts of metal are etched by electroetch or electrochemical etching to provide the conductor 104 with a top metal surface generally coplanar to the top surface of the patterned dielectric 102. In another embodiment, the planar surface is formed by chemical mechanical polishing (CMP). The CMP process planarizes the surface of the interconnect structure by a combination of chemical and mechanical etching using multi-step polishing with selective and non-selective slurry compositions generally known in the art. Alternatively, a planar surface can be formed by a non-selective plasma etching process, termed "etchback". The etchback process can include additional planarizing layers deposited onto metal layer. For example, a layer of photoresist can be deposited onto metal layer prior to performing the non-selective etch process.

The patterned dielectric 102 can be SiO$_2$, SiC, SiN, SiC(N, H) or any low k (i.e., k value less than 3.0) including inorganic or organic dielectrics. The dielectric material can be porous or non-porous. Some examples of suitable dielectrics that can be used as the dielectric material include, but are not limited to: SiO$_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The patterned dielectric 102 can be deposited by PECVD procedures as is generally known in the art.

The conductor 104 can be any suitable conductor, including, but not limited to, copper, aluminum, tungsten, cobalt, ruthenium, alloys thereof, and mixtures thereof. In some structures, copper can be used and can include one or more alloying elements such as C, N, O, Cl, S, Mn, Al, etc. which have been shown to improve the reliability of the copper conductor. The amount of alloying element in the copper alloy is typically in the range of about 0.001 weight percent (wt. %) to about 10 wt %).

The conductor 104 can be formed by CVD, PVD (sputtering), electrochemical deposition or like processes. For example, the deposition of copper can be done by electroplating or electroless plating as are known in the art.

Optionally, a conformal seed layer (not shown) can be deposited prior to deposition of the conductor. The function of the seed layer is to provide a base upon which the metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments of the invention, the deposited seed layer will contain from about 1 atomic percent to about 7 atomic percent. Examples of seed layers are copper, copper manganese, and the like.

Figure 4:
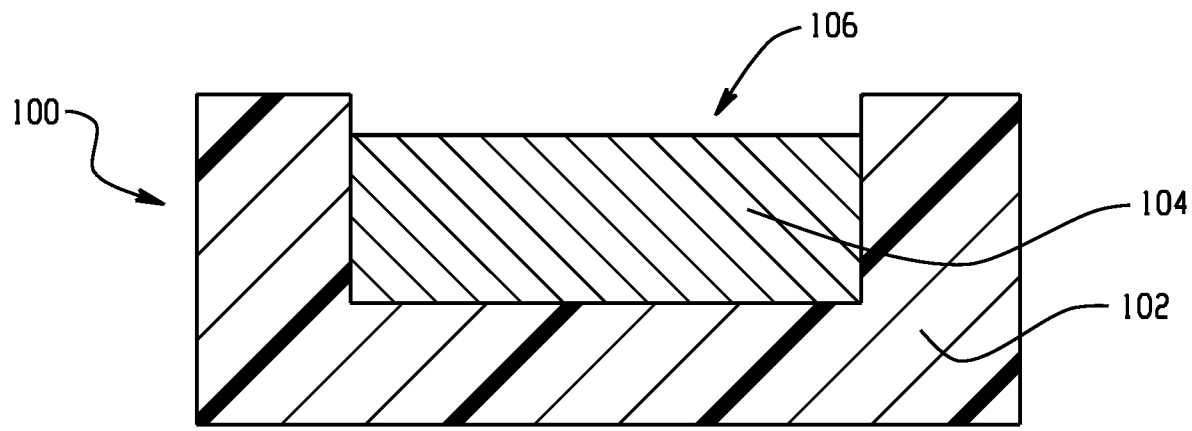
FIG. 4 depicts a cross section of the structure of FIG. 3 subsequent to via patterning of a dielectric layer in accordance with one or more embodiments of the present invention.

FIG. 4 schematically illustrates the structure 100 of FIG. 3 subsequent to formation of a recess 106 of the conductor 104 relative to the patterned dielectric 102. In one or more embodiments of the invention, the recess depth can range from about 5 nanometers to about 150 nanometers. A block mask can be sued to form the recess and a portion of the conductor can be removed by a wet or dry chemical process or combination of a wet and dry chemical process.

Figure 5:
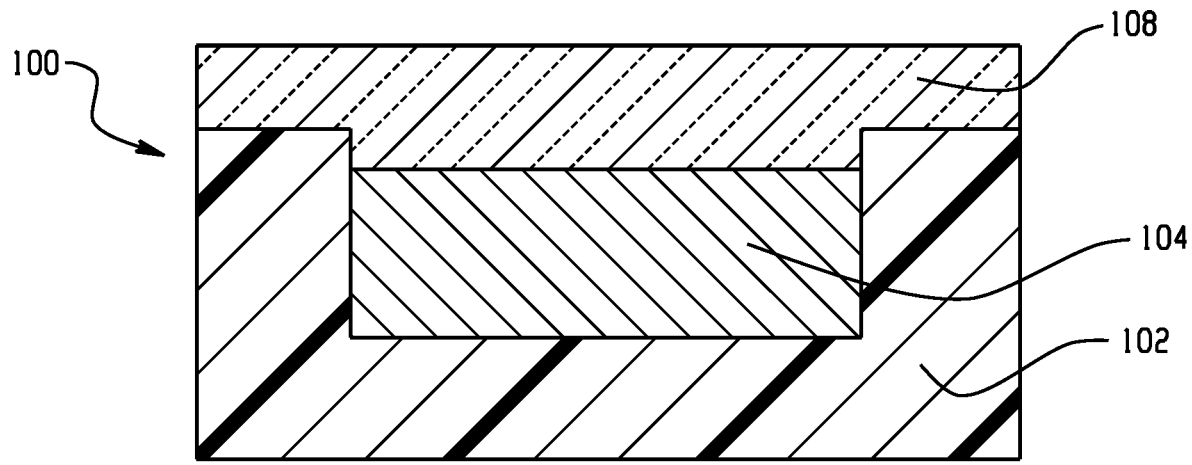
FIG. 5 depicts a cross section of the structure of FIG. 4 subsequent to metal fill of the via and planarization in accordance with one or more embodiments of the present invention.

FIG. 5 schematically illustrates the structure 100 of FIG. 4 subsequent to deposition of an insulator 108 to fill the recess. The insulator 108 can be an organic planarization layer or the like. The insulator can be SiO$_2$, SiC, SiN, SiC(N,H), or the like.

Figure 6:
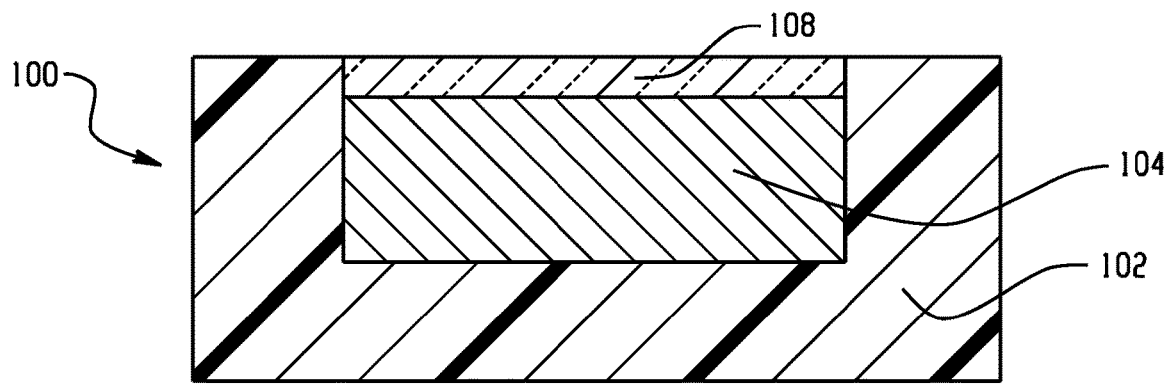
FIG. 6 depicts a cross section of the structure of FIG. 5 subsequent to deposition of a multilayer structure including hardmask layers thereon in accordance with one or more embodiments of the present invention.

Alternatively, as shown in FIG. 6, the insulator 108 can be subjected to a planarization process such as CMP to form a top planar surface such that an upper surface of insulator 108 is coplanar with an upper surface of the patterned dielectric layer 102.

Figure 7:
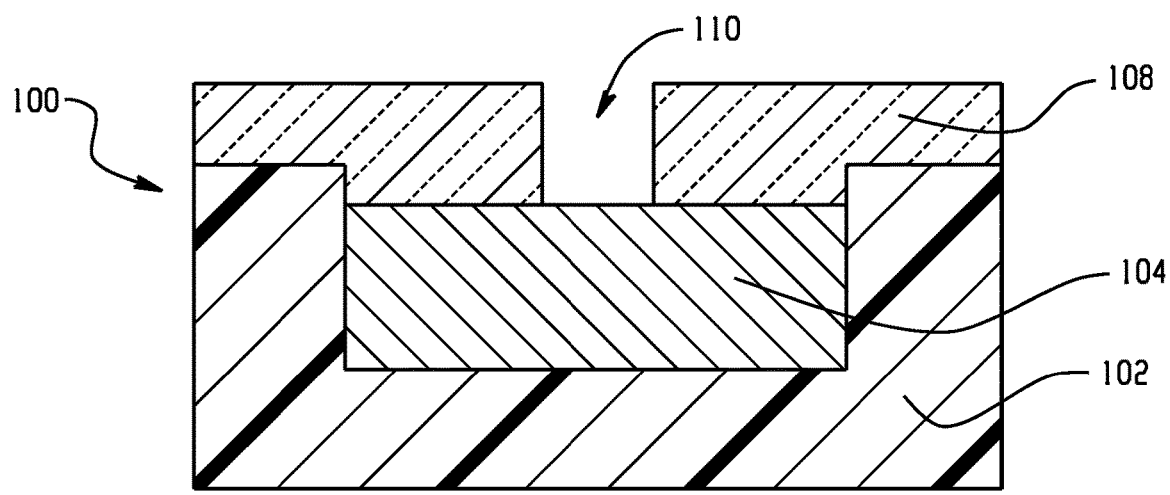
FIG. 7 depicts a cross section of the structure of FIG. 6 subsequent to patterning of the hardmask layers in accordance with one or more embodiments of the present invention.

FIG. 7 schematically illustrates the structure 100 of FIG. 5 subsequent to lithographic patterning the insulator 108 to form a via contact opening 110. Lithographic patterning generally includes applying a trilayer including an organic planarization layer deposited onto the insulation layer 108, a Si-containing mask layer deposited onto the organic planarization layer, and a photoresist layer on the Si-containing mask layer. The photoresist layer is patterned to form an opening having a defined "lithographic" width (W1).

The planarization layer can be a polymer including carbon, hydrogen, oxygen, and optionally nitrogen, fluorine, and silicon. In one or more embodiments of the invention, the planarization layer is a polymer with sufficiently low viscosity so that the top surface of the applied polymer forms a planar horizontal surface. The planarization layer, which can be a spin-deposited layer, can be baked at an elevated temperature to cure the planarization layer, if needed, and reflow its top surface into a substantially planar form. Exemplary materials defining the organic planarizing layer that can be employed in the invention include, but are not limited to: diamond-like carbon (DLC), fluorinated DLC, polyimides, fluorinated polyimides, parylene-N, parylene-F, benzocyclobutanes, poly(arylene ethers), polytetrafluoroethylene (PTFE) derivatives marketed by Du Pont de Nemours, Inc. under the registered trademark Teflon AF, poly (naphthalenes), poly(norbornenes), foams of polyimides, organic xerogels, porous PTFE and other nano-, micro- or macro-porous organic materials.

The Si-containing mask layer can serve as a mask to pattern the underlying layer. The Si-containing mask layer is not intended to be limited and can include a low-temperature oxide (SiO$_2$), a Si-containing antireflection layer (SiARC), or other polymeric layers of polyelectrolyte and colloidal particles, sol-gels produced through reactions of modified silanes and organic solvents, or conductive polymers.

The photoresist layer can be formed using conventional deposition techniques such chemical vapor deposition, plasma vapor deposition, sputtering, dip coating, spin-on coating, brushing, spraying and other like deposition techniques can be employed. Following formation of the photosensitive resist layer, the photosensitive resist layer is exposed to a desired pattern of radiation such as ultraviolet radiation, vacuum ultraviolet radiation, extreme ultraviolet (EUV) radiation, X-ray radiation, electron beam radiation or the like. Illustrative examples of 193 nm vacuum ultraviolet photosensitive resist layers include a methacrylate polymer, a phenolic based polymer or a copolymer thereof. Other types of organic photoresists such as, for example, polyesters can also be employed.

Figure 8:
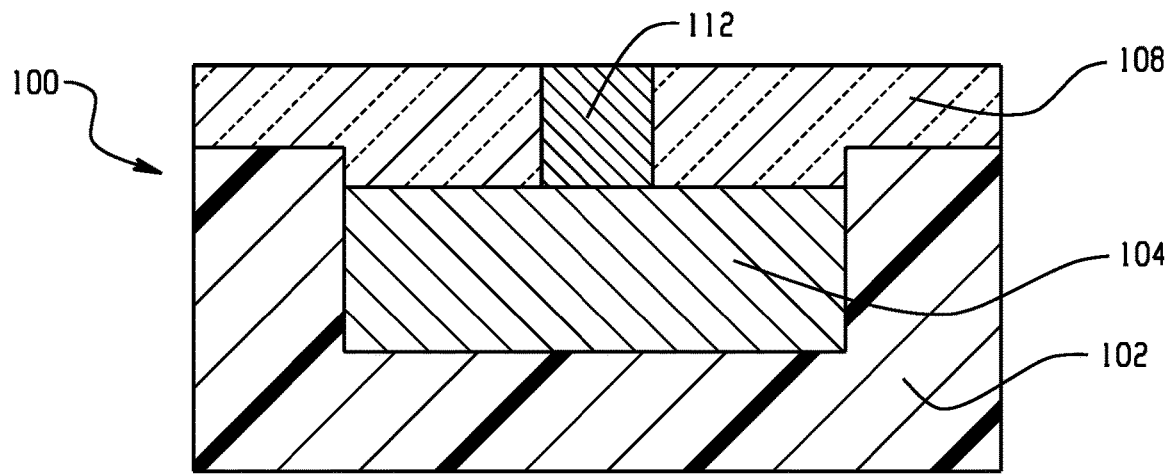
FIG. 8 depicts a cross section of the structure of FIG. 7 subsequent to patterning the multilayer structure to form a pillar device structure in accordance with one or more embodiments of the present invention.

FIG. 8 schematically illustrates the structure 100 of FIG. 7 subsequent to filling the via contact opening with a metal to form a metal filled via contact structure 112. Suitable metals for filling the via contact opening include, without limitation, tungsten, aluminum, copper, tantalum, titanium, cobalt, ruthenium, iridium, rhodium, alloys thereof, nitrides thereof, and combination of at least one of the foregoing. The substrate is then subjected to a planarization process such as CMP so that the top surface of the metal filled via contact structure is coplanar with the top surface of the insulator 108.

Figure 9:
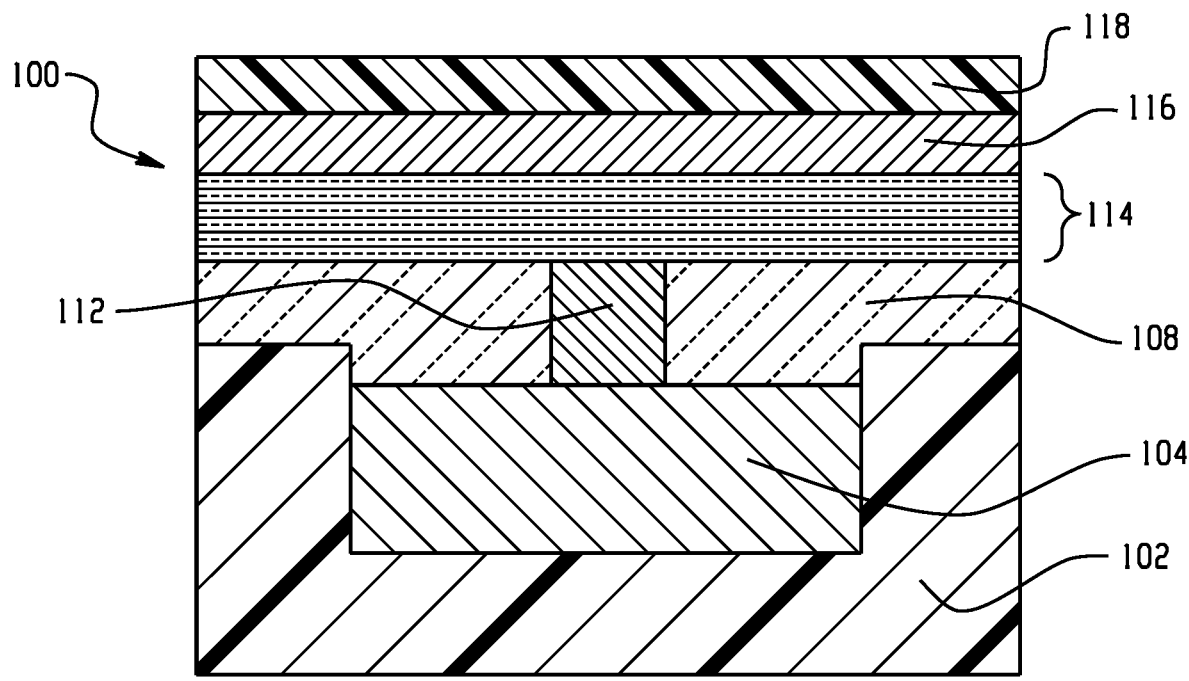
FIG. 9 depicts a cross section of a structure subsequent to deposition of a trilayer on a first interconnect structure in accordance with one or more embodiments of the present invention.

FIG. 9 schematically illustrates the structure 100 of FIG. 8 subsequent to deposition of a pillar device structure 114 including combinations of metal layers and insulating layers such as various metal oxides onto the planar surface. The pillar device structure overlies the metal filled via 112. Hard mask layers including a metal layer 116, and a dielectric layer 118 are then deposited onto the pillar device structure 112.

The dielectric hardmask layer 118 is not intended to be limited to any particular material so long as the dielectric hardmask provides etch selectivity during a later RIE or IBE process to pattern the pillar device structure 112 as will be described in greater detail below. Exemplary dielectric hard mask material include, without limitation, silicon dioxide, silicon nitride, silicon carbide, and the like.

The metal hardmask 116 is not intended to be limited, and can be a metal nitride such as tantalum nitride, titanium nitride, tungsten nitride, or the like. In one or more embodiments of the invention, the metal hardmask can be incorporated into the pillar device structure and function as a top electrode.

Figure 10:
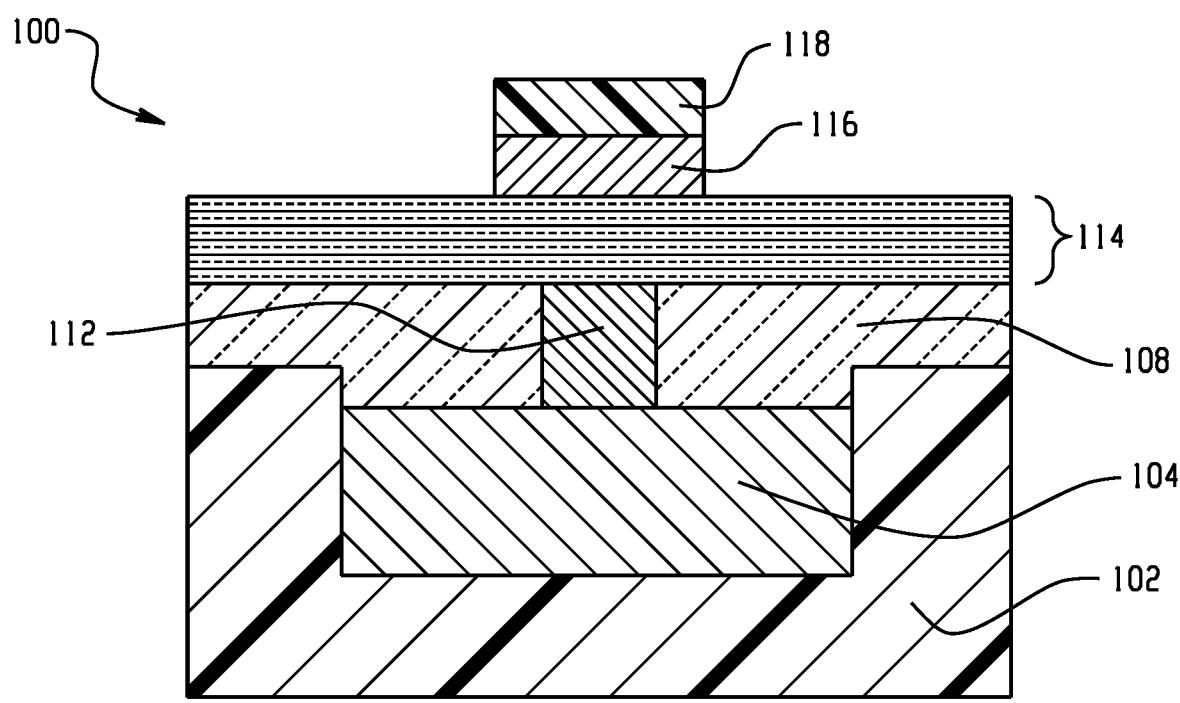
FIG. 10 depicts a cross section of the structure of FIG. 9 subsequent to patterning a photoresist layer in the trilayer to form a tapered profile in accordance with one or more embodiments of the present invention.

FIG. 10 schematically illustrates the structure 100 of FIG. 9 subsequent to lithographic and RIE patterning of the dielectric hardmask 118 and underlying metal hardmask 116. Lithographic patterning generally includes applying a photoresist to the surface of the dielectric hardmask, exposing the photoresist to a desired pattern of radiation, and developing the exposed resist utilizing a photoresist developer to form a pattern. The photoresist pattern is then transferred into the dielectric hardmask using an etching process such as RIE. The etching process can be a dry or wet etching process.

The term "wet etching" generally refers to application of a chemical solution. This can be a time-controlled dip in the etch solution. Suitable etch solutions include $HNO_3$, HCL, $H_2SO_4$, HF or combinations thereof.

The term "dry etching" is used here to denote an etching technique such as reactive-ion-etching (RIE), ion beam etching, plasma etching or laser ablation. During the etching process, the pattern is first transferred to the dielectric layer. The patterned photoresist is typically, but not necessarily, removed from the structure after the pattern has been transferred into the dielectric film. The patterned feature formed into the dielectric material includes the contact holes.

The lithographic and etching process is repeated for patterning the metal hardmask 116.

Figure 11:
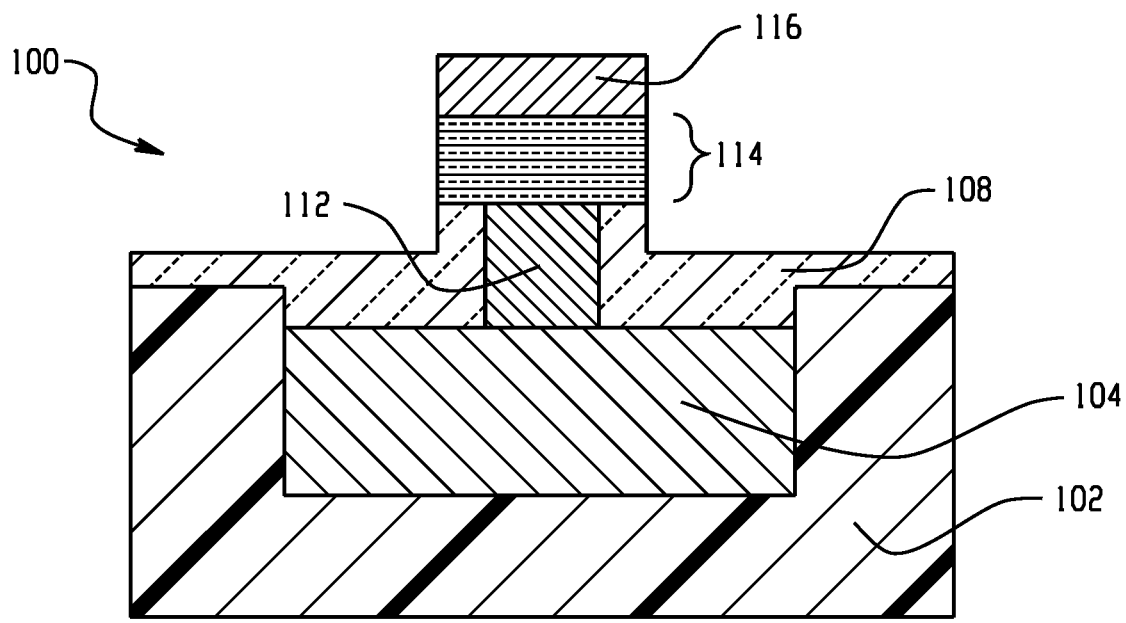
FIG. 11 depicts a cross section of the structure of FIG. 10 subsequent to transferring the opening in the photoresist layer to an underlying organic planarization layer in accordance with one or more embodiments of the present invention.

FIG. 11 schematically illustrates the structure 100 of FIG. 10 subjected to RIE or IBE to patterning of the pillar device structure down to the insulating layer 108, wherein a top surface of the insulator layer 108 overlays the patterned dielectric layer 102 (see FIG. 5). Because the hardmask layer 116 has a width dimension greater than the filled via 110 and an insulative material on sidewalls of the via contact structure, and because the IBE process is highly directional, there is no metal redeposition onto sidewalls of the pillar device structure. Instead, the IBE process stops on the insulator layer 108, and some of this insulating material can be re-deposited onto the pillar device structure sidewalls without detrimental electrical effects. The resulting structure 100 features a metal landing pad, i.e., the filled via contact structure 114, having a critical dimension smaller than the hardmask 116. The metal landing pad, i.e., filled via contact structure 112, is completely covered by the pillar device structure 114 such that the landing pad is not exposed during IBE, thereby eliminating metal redeposition.

Figure 12:
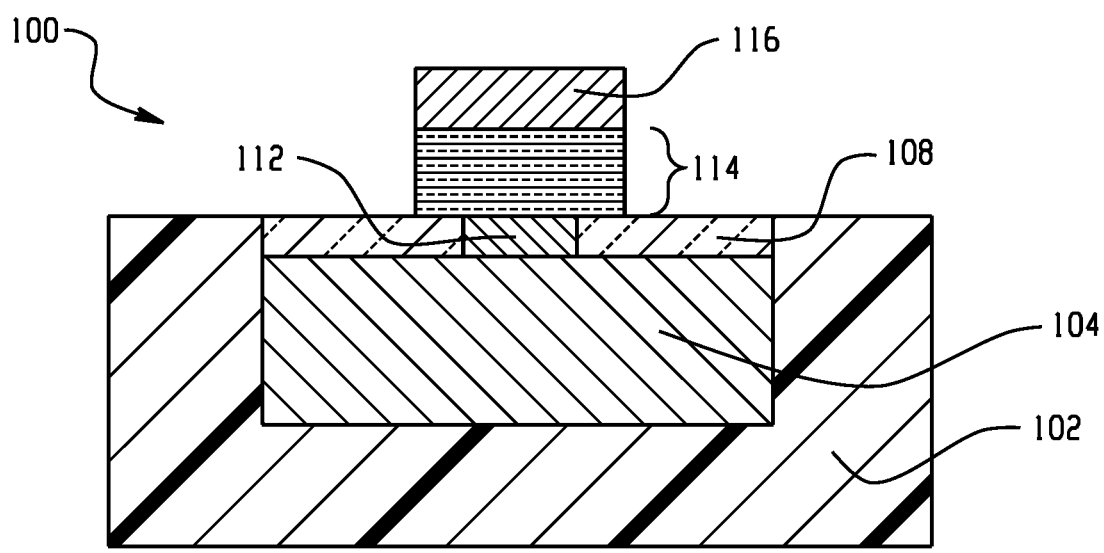
FIG. 12 depicts a cross section of the structure of FIG. 11 subsequent to transferring the opening in the photoresist layer to an underlying organic planarization layer in accordance with one or more embodiments of the present invention.

FIG. 12 illustrates an alternative embodiment, wherein a top surface of the insulating layer 108 is coplanar to the upper surface of the dielectric layer 102 (see FIG. 6). The structure 100 is then subjected to RIE or IBE to pattern the pillar device structure down to the insulating layer 108.

It should be apparent that depending on the thickness of the insulating layer 108 as is generally depicted in FIGS. 11-12, the height of the via contact structure can be optimized for the particular application.

The descriptions of the various embodiments of the present invention have been presented for purposes of illustration but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A back end of line (BEOL) metallization structure comprising:
    a vertical via structure intermediate and in electrical contact with an overlying pillar device and an underlying conductor, wherein the vertical via structure comprises an insulator material on sidewalls thereof, wherein the vertical via structure has a width dimension less than the width dimensions of the overlying pillar device and the underlying conductor, and wherein the pillar device comprises layers of a metal and layers of a metal oxide formed in an alternating fashion.

2. The BEOL metallization structure of claim 1, wherein the vertical via structure provides a bottom electrode for the pillar device structure.

3. The BEOL metallization structure of claim 1, wherein the vertical via structure has a height dimension smaller than a height dimension of the pillar device.

4. The BEOL metallization structure of claim 1, wherein the pillar device comprises a magnetoresistive random access memory (MRAM) device.

5. The BEOL metallization structure of claim 1, wherein the pillar device includes a magnetic tunneling junction layer.

6. The BEOL metallization structure of claim 1, wherein the vertical via structure comprises tungsten, aluminum, copper, tantalum, titanium, cobalt, ruthenium, iridium, rhodium, alloys thereof, nitrides thereof, and combination of at least one of the foregoing.

7. The BEOL metallization structure of claim 5, wherein the magnetic tunneling junction layer comprises a metal oxide.

8. A method of fabricating a back end of line (BEOL) metallization structure, the method comprising:
    forming a first interconnect structure by patterning a first dielectric layer to form a trench therein and depositing a metal conductor in the trench, wherein the metal conductor has a top surface coplanar to a top surface of the first dielectric layer;
    forming a recess in the metal conductor;
    forming a second dielectric layer on the first interconnect structure, wherein the second dielectric layer fills the recess and overlies the first dielectric layer;
    reactive ion etching the second dielectric layer to form a via opening and expose a surface of the metal conductor in the first interconnect structure;
    filling the via opening with a metal to form a metal filled via;
    depositing layers of metals and at least one insulator material to form a multilayer stack;
    depositing a metal hardmask layer onto the multilayer stack;
    depositing a dielectric hardmask layer onto the metal hardmask;
    patterning the dielectric hardmask and the metal hardmask layers to provide a patterned dielectric hardmask and metal hardmask, wherein the patterned dielectric hardmask and metal hardmask overlie and have a width dimension greater than a width dimension of the metal filled via; and etching the multilayer stack using an ion beam etch process, wherein the multilayer stack completely covers the metal filled via.

9. The method of claim 8, wherein the metal filled via has a height extending from the underlying conductor to a top surface of the second dielectric layer.

10. The method of claim 8, wherein the multilayer structure comprises a magnetoresistive random access memory (MRAM) device or a magnetic tunneling junction device.

11. The method of claim 8, wherein the insulating layer comprises metal oxide and the metal layers are selected to be magnetic.

12. The method of claim 8, wherein the at least one metal filled via provides a bottom electrode of a multilayer structure.

\* \* \* \* \*